United States Patent [19]

Kuwata

[11] Patent Number: 5,100,831
[45] Date of Patent: Mar. 31, 1992

[54] METHOD FOR FABRICATING SEMICONDUCTOR DEVICE

[75] Inventor: Nobuhiro Kuwata, Yokohama, Japan

[73] Assignee: Sumitomo Electric Industries, Ltd., Osaka, Japan

[21] Appl. No.: 649,640

[22] Filed: Feb. 1, 1991

[30] Foreign Application Priority Data

Feb. 16, 1990 [JP] Japan .................................. 2-35876
Feb. 16, 1990 [JP] Japan .................................. 2-35878
Mar. 8, 1990 [JP] Japan .................................. 2-57345

[51] Int. Cl.⁵ .......................................... H01L 21/20
[52] U.S. Cl. ........................................ 437/89; 437/93; 437/126; 437/133; 437/45; 148/DIG. 72
[58] Field of Search ............... 437/89, 93, 126, 133, 437/45; 148/DIG. 72; 357/16, 23.12

[56] References Cited

U.S. PATENT DOCUMENTS 4,085,498 4/1978 Rideout .................................. 437/52
4,166,223 8/1979 Bluzer .................................. 357/22
4,177,390 12/1979 Cappon .................................. 307/450

FOREIGN PATENT DOCUMENTS 0001223 1/1982 Japan .................................. 437/93

Primary Examiner—Brian E. Hearn
Assistant Examiner—Tuan Nguyen
Attorney, Agent, or Firm—Stevens, Davis, Miller & Mosher

[57] ABSTRACT

A semiconductor device comprising a plurality of elemental active devices being operable with different threshold voltages is disclosed. Each of the elemental active devices, e.g. D made and E made HEMT, is formed of each of different active layers epitaxially grown on each of different regions of a semiconductor substrate. Since the different regions have different surface orientations or surface areas, each of the different active layers have different carrier densities corresponding to the surface orientation or the surface areas.

7 Claims, 10 Drawing Sheets

5,100,831

METHOD FOR FABRICATING SEMICONDUCTOR DEVICE

BACKGROUND OF THE INVENTION

1. Field of the Invention

The present invention relates to a semiconductor device having a plurality of elemental active devices such as field effect transistors capable of being operated by two or more different voltages, and relates to a method for fabricating the same.

2. Related Background Art

FIG. 1A shows a sectional view of a conventional type of semiconductor device having two different active devices and, more specifically, shows a sectional view of an inverter circuit constituted by two types of heterojunction field effect transistors (to be referred to as FETs hereinafter). As shown in FIG. 1A, a non-doped GaAs layer 2, an n-type AlGaAs layer 3 having a smaller electron affinity than that of the nondoped GaAs layer 2 and containing a donor impurity, and an n-type GaAs layer 4 are formed on a semi-insulating GaAs substrate 1. The n-type GaAs layer 4 and the n-type AlGaAs layer 3 are partially etched, and gate electrodes 5 are formed. Source and drain electrodes 6 are then formed on the n-type GaAs layer 4, and wirings 8 are formed thereon through an insulating film 7.

A gate threshold voltage of a heterojunction FET is generally determined by the impurity concentration and thickness of the n-type AlGaAs layer under the gate electrode. In an illustrated inverter circuit, in order to form an enhancement mode (to be referred to as an E mode hereinafter) FET and a depletion mode (to be referred to as a D mode hereinafter) FET on a single substrate, the thickness of the AlGaAs layer 3 is changed depending on the region for forming an E or D mode FET element. More specifically, by changing the thickness of the active layer consisting of AlGaAs, FETs having different threshold voltages can be formed on a single substrate. In this case, recess (groove) etching must be repeated twice in the gate electrode formation step, thus complicating the formation process. Etching methods include wet etching and dry etching. Even if either technique is used, it is difficult to accurately perform recess etching for different depths with good reproducibility.

Japanese Patent Laid-Open No. 60-116178 discloses another conventional semiconductor device consisting of E and D mode FETs being operable with different threshold voltages. The technique for fabricating this semiconductor device will be briefly described below. An AlGaAs layer is formed to have a thickness corresponding to a difference between E and D mode n-type AlGaAs layers. Prior to recess etching, a prospective gate electrode formation region of the E mode FET is selectively removed, and the gate electrode formation step is performed simultaneously for the E and D mode FET elements. According to this technique, however, the step of selectively removing a narrow region of the prospective gate electrode formation region of the E mode FET with good reproducibility is increased, resulting in the complicated process.

In addition, Solid-State Device Conference (1984), pp. 359 to 362 discloses another conventional semiconductor device. In the technique for fabricating this semiconductor device, an etching stopper layer is provided to form an E mode high electron mobility transistor (to be referred to as an HEMT hereinafter) and a D mode HEMT on a single substrate. This technique will be briefly described with reference to FIG. 1B. A nondoped GaAs layer 12, an Si-doped AlGaAs layer 13, upper layers 14, 15, and 16 are epitaxially grown on a semi-insulating GaAs substrate 11 by molecular beam epitaxy (to be referred to as MBE hereinafter). The upper layers are constituted by the GaAs layers 14 and 16, and the AlGaAs etching stopper layer 15 formed between them. The upper layers 14, 15, and 16 and the AlGaAs layer 13 are partially and selectively etched, and gate electrodes 20 are formed. Source and drain electrodes 21 are then formed on the GaAs layer 16, and wirings 19 are then formed thereon through insulating films 17 and 18 consisting of $SiO_2$.

According to this technique, however, a crystal growth time is undesirably prolonged, and any one of the areas must be exposed prior to formation of the gate electrodes, thereby increasing high-precision steps with good reproducibility and complicating the fabrication process.

Farther, there is no method of easily forming a semiconductor device having three or more types of active devices being operable with different threshold voltages on a single semiconductor substrate. When active devices having three or more threshold voltages are forcibly formed on a single semiconductor substrate, the thicknesses of active layers must be changed in accordance with types of active device. Therefore, the above complicated methods must be combined to perform recess etching of the high-precision active layers three times or more with good reproducibility.

SUMMARY OF THE INVENTION

It is an object of the present invention to provide a simplified method for fabricating a semiconductor device comprising a plurality of elemental active devices having different operating threshold voltages at high yield.

It is another object of the present invention to provide a method for fabricating a semiconductor device having a plurality of elemental active devices being operable with different threshold voltages, comprising the following steps. In the first step, an exposed surface having a surface orientation coinciding with a normal to a predetermined crystal plane in a predetermined region is formed on a semiconductor substrate having an exposed surface of a surface orientation slightly inclined from the normal to the predetermined crystal plane by anisotropic etching. In the second step, a material containing an impurity is supplied to the exposed surfaces including portions inside and outside the predetermined region, thereby growing a plurality of semiconductor layers having different carrier densities corresponding to the surface orientations of said exposed surfaces. In the third step, the plurality of elemental active devices are fabricated from the plurality of semiconductor layers, each elemental active devices being operable with different threshold voltages corresponding to the carrier densities of the plurality of semiconductor layers.

According to the above described method, in the step of crystal growth of the active layers, the active layers formed on the exposed surfaces having different surface orientations have different carrier densities depending on their surface orientations. When predetermined electrodes are formed on the plurality of active layers having the different carrier densities, a plurality of elemental active devices having different threshold voltages can be formed on a single substrate. That is, according to the method of the present invention, only one step of crystal growth is required to form a differences between the threshold voltages for operating the elemental active devices.

It is still another object of the present invention to provide a method for fabricating a semiconductor device having a plurality of elemental active devices being operable with different threshold voltages, comprising the following steps. In the first step, a mask pattern is formed on a semiconductor substrate, the mask pattern partially covering the semiconductor substrate, so that exposed surfaces are formed in plurality of regions having two or more different areas. In the second step, material containing an impurity is supplied to the exposed surfaces within the regions not covered with the mask pattern, thereby growing a plurality of semiconductor layers having different carrier densities corresponding to the surface areas of said exposed surfaces. In the third step, said plurality of elemental active devices are fabricated on said semiconductor substrate, each elemental active devices being operable with different threshold voltages corresponding to the carrier densities of the plurality of semiconductor layers.

According to the above described method, in the step of crystal growth of the semiconductor layer, the active layers formed on the exposed surface which is not covered with the mask pattern will have different carrier densities depending on the magnitudes of the areas of the exposed surface. When predetermined electrodes and the like are formed on the two or more active layers having different carrier densities, two or more different types of elemental active device having different threshold voltages can be formed on a single substrate. That is, according to the method of the present invention, in order to differentiate the threshold voltages for operating the elemental active devices, only one crystal growth step is required.

It is still another object of the present invention to provide a method for fabricate a semiconductor device having a plurality of elemental active devices being operable with different threshold voltage, wherein the above two methods are combined.

According to the above described method, in the step of crystal growth of active layers, active layers formed on the exposed surfaces of the semiconductor substrate having different surface orientations have different carrier densities depending on their surface orientations. Further, in the step of crystal growth of active layers, active layers selectively formed on the exposed surface not covered with the mask pattern have different carrier densities depending on differences in exposed surface areas. By combining the surface orientations and the area differences of the exposed surfaces, many types of active layers having different carrier densities can be formed. When predetermined electrodes are formed on these active layers, many types of elemental active device having different threshold voltages can be formed on a single semiconductor substrate. That is, according to the method of the present invention, an easy prestep of forming a difference between threshold voltages for operating the elemental active device and a single step of crystal growth are required.

It is still another object of the present invention to provide a new type of semiconductor device comprising a plurality of elemental active device having different operating threshold voltages, whose fabrication process is simplified and highly reproducible.

It is still another object of the present invention to provide a semiconductor device, comprising a plurality of elemental active devices being operable with different threshold voltages, in which each elemental active device is formed of each of different active layers epitaxially grown on each of different regions of a semiconductor substrate, and both different regions have different surface orientations. It is still another object of the present invention to provide a semiconductor device, comprising a plurality of elemental active devices being operable with different threshold voltages, is which each elemental active device is formed of each of different active layers epitaxially grown on each of different regions of a semiconductor substrate, and both different regions have different surface areas.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

The principles of the present invention will be briefly described below. In order to form a plurality of elemental active devices (e.g., FETs) operated with different threshold voltages, thickness of the semiconductor layer serving as an active layer is not controlled, but its impurity concentration is controlled. This impurity control utilizes a feature of crystal growth. More specifically, differences in carrier densities (impurity concentrations) of semiconductor layers containing an impurity, depending on differences in surface orientations and/or areas of the exposed surfaces of the semiconductor substrate, are utilized.

Figure 2:
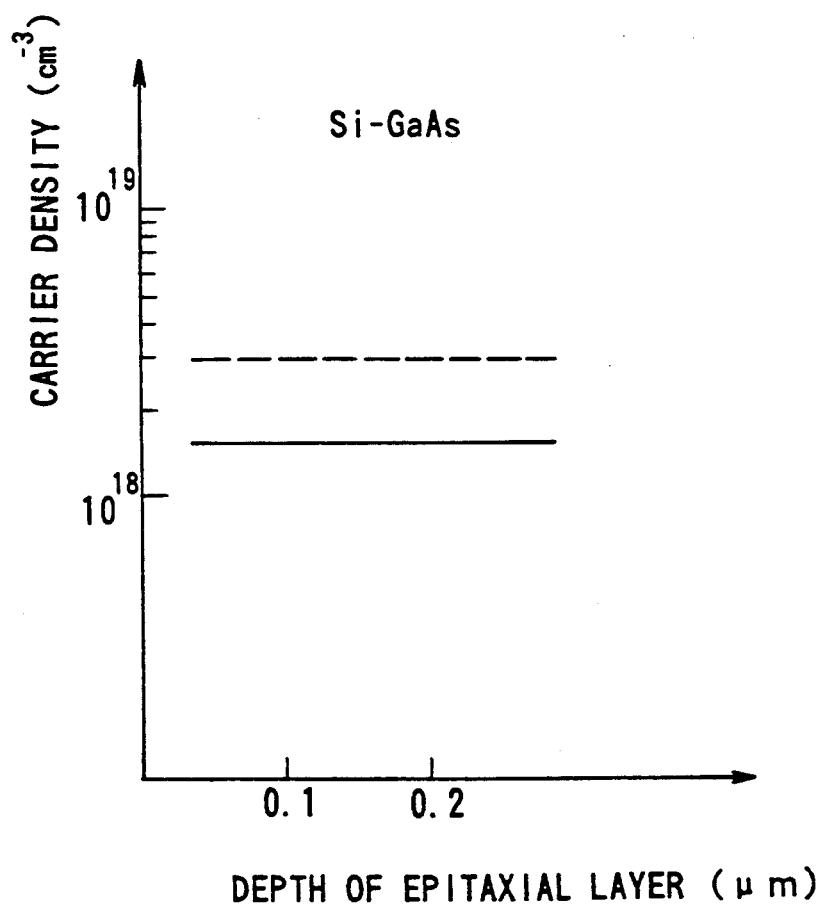
FIG. 2 shows carrier density plotted against thickness of epitaxial layers grown on exposed surfaces with surface orientation of the exposed surfaces as a parameter.

FIG. 2 shows an influence of the presence/absence of an inclination angle from the crystal orientation on carrier densities of semiconductor layers grown on the exposed surface of two types of semiconductor substrates. The semiconductor substrates of the one type are GaAs substrates (to be referred to as a just substrate hereinafter) having an exposed surface (to be referred to as a just surface) whose crystal plane coincides with a predetermined crystal plane, i.e., (100) crystal plane, and the semiconductor substrates of the other type are GaAs substrates (to be referred to as a 2°-off-substrate hereinafter) having an exposed surface (to be referred to as 2°-off-surface) misoriented by 2° from a normal to the (100) crystal plane toward the adjacent <110> direction. GaAs layers intentionally doped with Si (to be referred as Si-doped GaAs layers hereinafter) are epitaxially grown on the just substrates and the 2°-off-substrates in the same conditions by an organo metallic vapor phase epitaxy method (to be referred to as an OMVPE method hereinafter). The Si-doped GaAs layers are measured to obtain carrier densities. As shown in FIG. 2, a carrier density (cm$^{-3}$) obtained by capacitance-voltage measurement is plotted along the ordinate, and the depth of the grown Si-doped GaAs layer is plotted along the abscissa. The solid line indicates the carrier density of the Si-doped GaAs layer formed on the just substrate, while the broken line indicates the carrier density of the Si-doped GaAs layer formed on the 2°-off-substrate. As is apparent from FIG. 2, the carrier density of the Si-doped GaAs layer formed on the 2°-off-substrates is higher than that formed on the just substrate about 1.7 times. It is assumed that a difference between the carrier densities is caused by a difference between amounts of Si atoms supplied or entrained during epitaxial growth of GaAs in accordance with the surface orientations of the exposed surfaces of the semiconductor substrates. Thus the same phenomenon should appear during epitaxial growth of AlGaAs.

Figure 3:
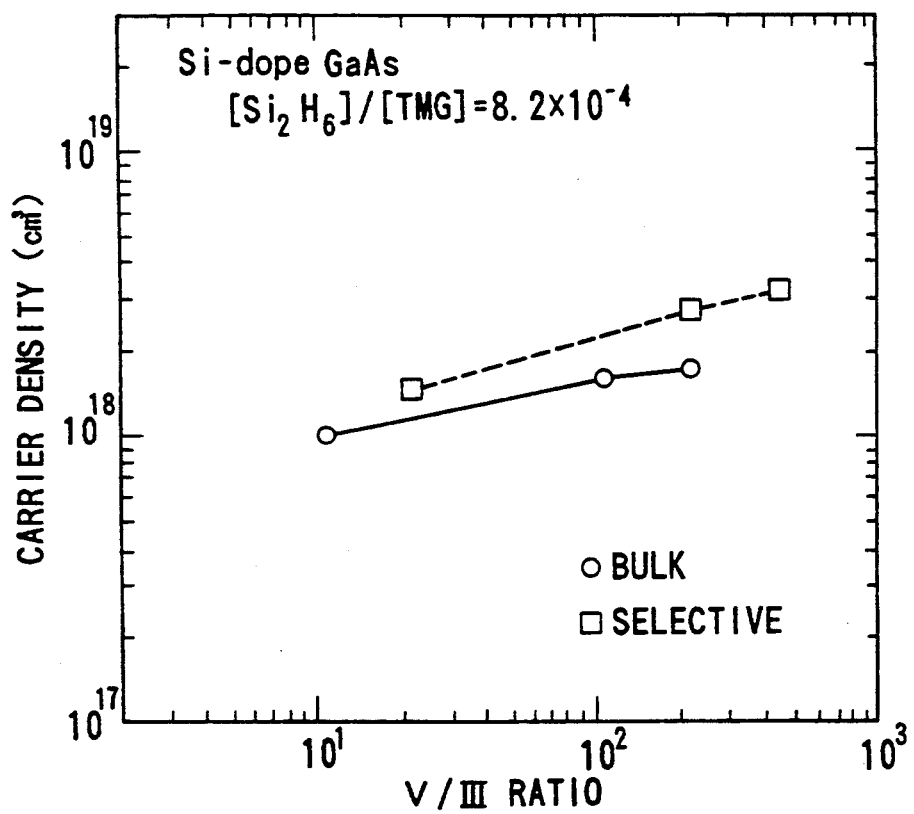
FIG. 3 shows carrier density plotted against III/V ratio of epitaxial layers grown on exposed surfaces with surface area of the exposed surfaces as a parameter.

FIG. 3 shows an influence of areas of the exposed surfaces of the semiconductor substrates on the carrier densities of the semiconductor layers formed on these semiconductor substrates. A carrier density (cm$^{-3}$) obtained by Hall measurement is plotted along the ordinate, and a V/III ratio, i.e., a supply mol ratio of arsine (AsH$_3$) as a material of a Group V element of As to trimethyl gallium (TMG) as a material of a Group III element of Ga is plotted along the abscissa. In the growth of the semiconductor layers, the supply mol ratio of disilane (Si$_2$H$_6$) as an Si dopant to trimethyl gallium (TMG) as a material for the Group III element of Ga is kept constant. The carrier density plotted by hollow rectangles is obtained by selectively growing Si-doped GaAs on a GaAs substrate according to the OMVPE method. In this case, the surfaces of the GaAs substrates are selectively exposed to have a width of 100 μm. The remaining surface is covered with an insulating mask. The carrier density plotted by hollow circles is obtained by performing bulk growth on the GaAs substrates according to the same growth method as described above. For example, for V/III=200, selectively grown Si-doped GaAs layer exhibits a carrier density of 2.8 × 10$^{18}$ cm$^{-3}$, while bulk-grown Si-doped GaAs layer exhibits a carrier density of 1.6 × 10$^{18}$ cm$^{-3}$. In this case, the selectively grown Si-doped GaAs layer has a carrier density about 1.75 times higher than that of the bulk-grown Si-doped GaAs. This may be assumed that supply of a material per unit area is increased since the exposed area subjected to growth of the semiconductor layer in selective growth is smaller than that in bulk growth.

When exposed surfaces having different surface orientations and/or different areas are combined and formed on the semiconductor substrates, semiconductor layers having different impurity concentrations can be epitaxially grown on these exposed surfaces. More specifically, by preparing regions having different surface orientations and/or surface areas utilizing a mask pattern which does not require much precision, semiconductor layers having different carrier densities can be formed in one crystal growth step with good reproducibility. In addition, since semiconductor layers, i.e., active layers having different carrier densities can be formed in desired regions, a plurality of FETs or the like having different threshold voltages can be formed on a single substrate with arbitrary design.

A method of the first embodiment according to the present invention will be described below. FIGS. 4A to 4E show process steps of the method of the first embodiment.

Figure 4A:
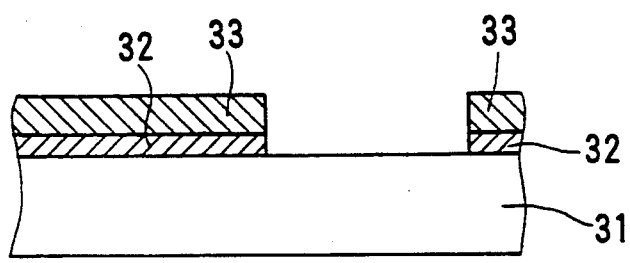
FIGS. 4A to 4E show a method for fabricating a semiconductor device according to the first embodiment of the present invention.

An insulating film 32 (e.g., SiN$_x$ or SiO$_2$) is formed on the entirely exposed surface of a 2°-off-substrate 31, and a pattern having an opening in a predetermined region is formed by a photoresist 33. The insulating layer 32 is selectively etched by RIE (Reactive Ion Etching). FIG. 4A is a sectional view of the insulating layer 32 left on the 2°-off-substrate upon etching.

Figure 4B:
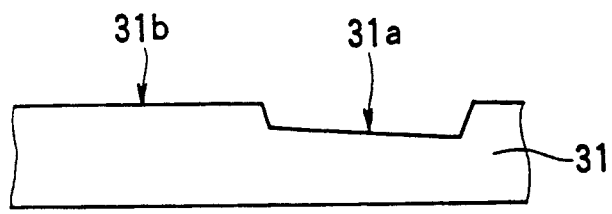

Anisotropic etching of the GaAs substrate 31 is performed using this insulating layer 32 as a mask and an etching solution of sulfuric acid: hydrogen peroxide: water=1:5:1. As exposed surface 31a at the bottom of the resultant recess serves as a just surface. When the mask for the insulating layer 32 is removed, a semiconductor substrate 31 having the exposed surface 31a serving as the just surface and an exposed surface 31b serving as the 2°-off-surface (FIG. 4B).

Figure 4C:
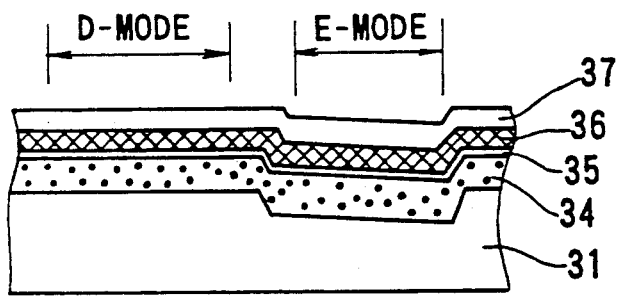

A nondoped GaAs layer 34 of 5,000 Å thick and non-doped AlGaAs layer 35 of 50 Å thick are sequentially grown on the semiconductor substrate 31 by an OMVPE method. Subsequently, a 300-Å thick Si-doped AlGaAs layer 36 is grown. This structure is so-called HEMT structure. Gate threshold voltage is ruled by carrier density and thickness of Si-doped AlGaAs layer. The carrier density (electron density) of the Si-doped AlGaAs layer 36 is 2 × 10$^{18}$ cm$^{-3}$ on the exposed surface as the just surface, and the carrier density of the layer 36 is 3.4 × 10$^{18}$ cm$^{-3}$ on the exposed surface 31b as the 2°-off-surface. Therefore, the semiconductor layer formed on the exposed surface 31a serving as the just surface is to be a region in which an active device (E mode HEMT in this embodiment) comprising an active layer having a lower carrier density is formed. On the other hand, the semiconductor layer formed on the exposed surface 31b serving as the 2°-off-surface is to be a region in which an active device (D mode HEMT in this embodiment) comprising an active layer having a higher carrier density is formed. Thereafter, a Si-doped GaAs layer 37 of 300 Å thick is grown (FIG. 4C).

Figure 4D:
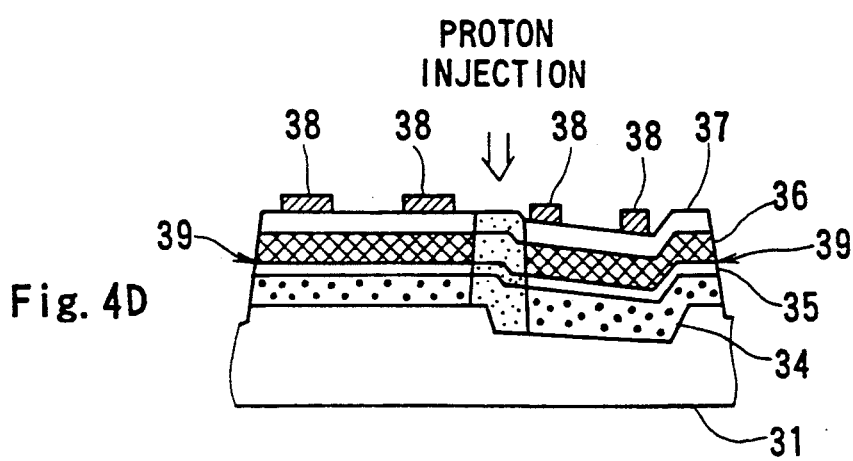

Device isolation is performed by mesa etching or proton injection (in the illustrated embodiment, both ends of the semiconductor device are mesa-etched, and proton is injected between the semiconductor elements). Ohmic electrodes 38 are then formed (FIG. 4D).

Figure 4E:
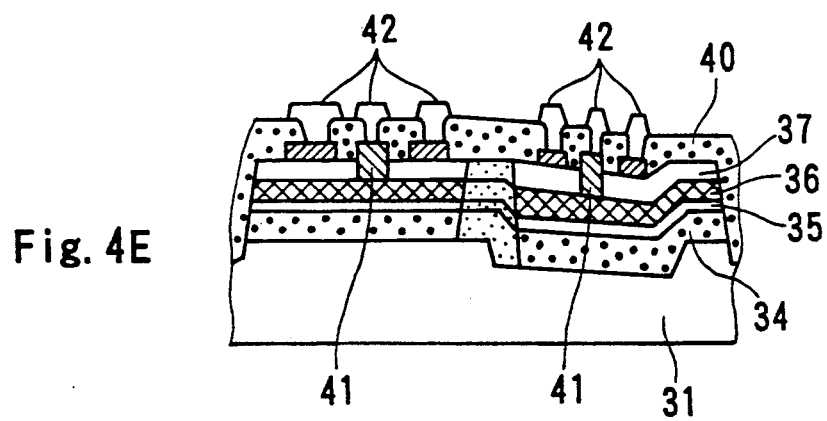

Subsequently, the Si-doped GaAs layer 37 and the Si-doped AlGaAs layer 36 of both the E and D mode HEMTs are partially and selectively removed, and gate electrodes 41 are formed. An insulating film (e.g., SiN$_x$ or SiO$_2$) 40 is formed on the entire surface of the resultant structure. A wiring pattern is formed, and metal wirings 42 are formed to complete the process (FIG. 4E).

As has been described above, according to the fabricating method of this embodiment, semiconductor layers or active layers having different carrier densities can be formed by one crystal growth step. In addition, since the mask for performing anisotropic etching need not be micropatterned with high precision, the steps prior to crystal growth can be simplified. Moreover, the electrodes for operating the active layers consisting of these semiconductor layers can be formed at the same time after the formation of the semiconductor layers. Thus, HEMTs having different threshold voltages can be easily formed at a high yield.

In the above embodiment, the exposed surface 31a in which the E mode FET is to be formed is constituted by the (100) surface, and the exposed surface 31b in which D mode FET is to be formed is constituted by a surface slightly inclined from the (100) plane to the (110) plane. These orientations can be arbitrarily set if the above-mentioned carrier density difference can be obtained, as a matter of course.

The above description has been concerned with a semiconductor device including HEMTs. The present embodiment, however, is not limited to this, but can be applied to the fabrication of a semiconductor device including MESFET (Metal Semiconductor FET)s, DMT(Doped-channel hetero-MISFET)s, or the like. The present embodiment is further applicable to a method of fabricating a semiconductor device such as an inverter constituted by a plurality of devices, i.e., a plurality of active devices using n-type semiconductor active layers epitaxially grown on the semiconductor substrate. Further, the present embodiment is applicable to a semiconductor device including an IC circuit having three or more active devices. The n-type impurity is not limited to Si, but can be replaced with an impurity such as Se, Te, or S.

A method of performing crystal growth of semiconductor layers having different carrier densities is not limited to the OMVPE method mentioned in the above embodiment. For example, semiconductor layers may be formed by using an MBE method or a CBE (chemical beam epitaxy) method.

A method of the second embodiment according to the present invention will be described below. FIGS. 5A to 5F show process steps of the method.

Figure 5A:
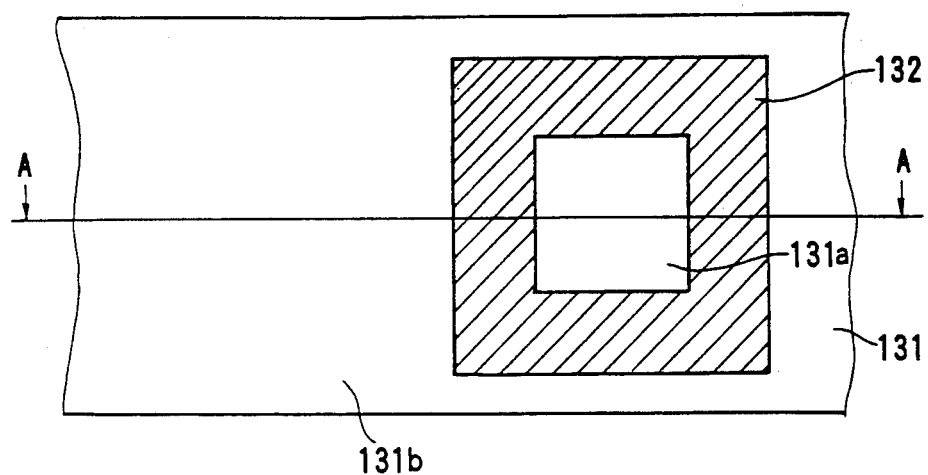
FIGS. 5A to 5F show a method for fabricating a semiconductor device according to the second embodiment of the present invention.
Figure 5B:
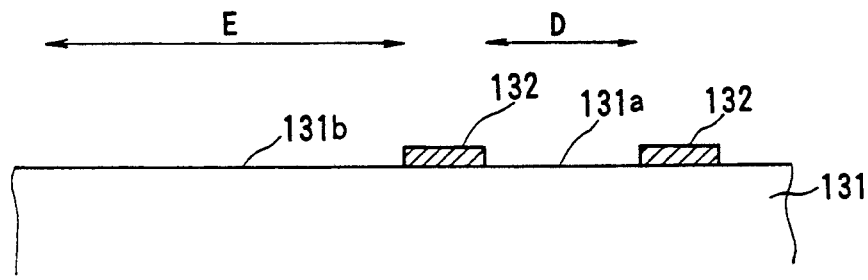

The entire surface of a semiconductor substrate 131 is covered with an insulating film 132 (e.g., SiN$_x$ or SiO$_2$), and a desired photoresist pattern having openings consisting of two or more different areas is formed. The insulating film 132 exposed is selectively etched by RIE, thereby obtaining a mask pattern corresponding to a photoresist pattern. FIG. 5A is a plan view in which a mask pattern, i.e., a nonetched insulating film 132 is hatched. FIG. 5B is a sectional view of FIG. 5A along the line A—A thereof. An exposed surface 131a through which the semiconductor substrate 131 is partially exposed and which is surrounded by the mask pattern, i.e., the insulating film 132, serves as a region in which an active device (a D mode HEMT in this embodiment) comprising an active region having a higher carrier density is formed. An exposed surface 131b which is not surrounded by the insulating film 132 serves as a region in which an active device (an E mode HEMT in this embodiment) comprising an active region having a lower carrier density is formed.

Figure 5C:
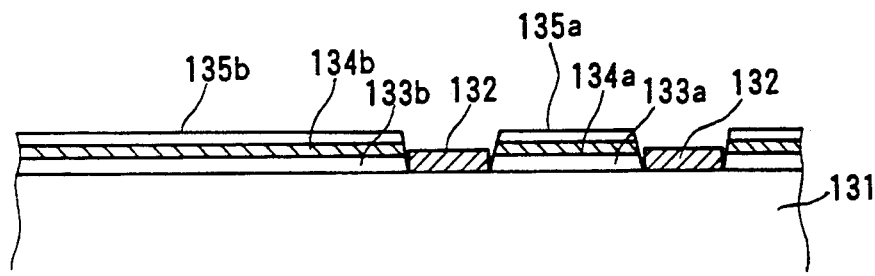

As shown in FIG. 5C, semiconductor layers such as nondoped GaAs layers 133a and 133b, Si-doped AlGaAs layers 134a and 134b, and Si-doped GaAs layers 35a and 135b are sequentially, epitaxially and selectively grown on the semiconductor substrate 131 by an OMVPE method. As has been described with reference to selective growth, the semiconductor layer 134a consisting of AlGaAs and formed on the exposed surface 131a surrounded by the insulating film 132 has a higher carrier density. On the other hand, the semiconductor layer 134b consisting of AlGaAs and formed on the exposed surface 131b not surrounded by the insulating film 132 has a lower carrier density.

Figure 5D:
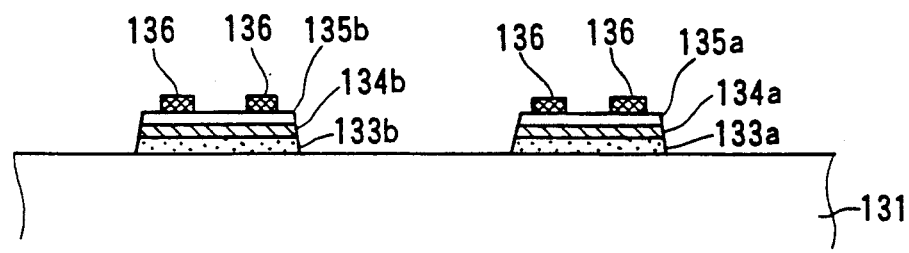

After removing the insulating film 132, the active devices are isolated from each other by mesa etching or proton injection, thereafter forming ohmic electrodes 136 (FIG. 5D).

Figure 5E:
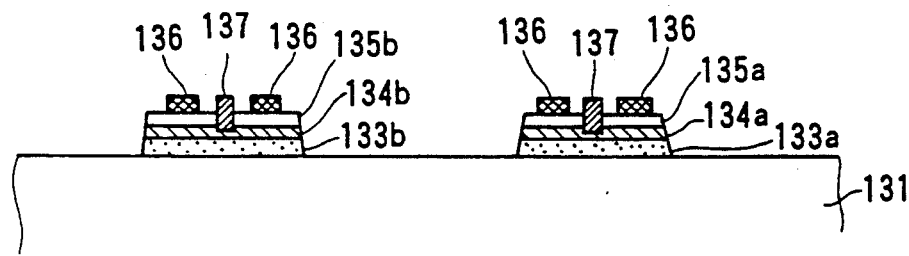

The Si-doped GaAs layers 135a and 135b and the Si-doped AlGaAs layers 134a and 134b of the prospective gate electrode formation regions of both the E and D mode FETs are partially and selectively removed, and gate electrodes 137 are formed (FIG. 5E).

Figure 5F:
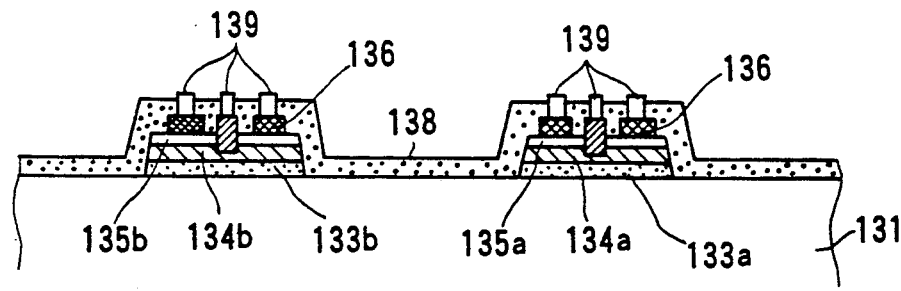

The entire surface is covered with an insulating film (e.g., SiN$_x$ or SiO$_2$) 138, and wiring patterns are formed in the insulating film 138. Metal wirings 139 are the formed to finish the process (FIG. 5F).

As has been described above, according to the fabricating method of this embodiment, semiconductor layers or active layers having different carrier densities can be formed by one crystal growth step. In addition, the process prior to crystal growth can be simplified in that the mask used for selective growth need not be frequently micropatterned with high precision. Furthermore, the electrodes for operating these semiconductor layers as active layers can be formed at the same time after the formation of these semiconductor layers. Therefore, HEMTs having different gate threshold voltages can be easily formed at a high yield. This embodiment can be effectively utilized for a semiconductor device constituted by an inverter or the like.

In the above embodiment, the shape of the exposed surface 131a in which the D mode HEMT is to be formed is square. However, the exposed surface may have any shape. Moreover, the exposed surface need not be surrounded by the insulating film. For example, a semiconductor layer may be grown in a stripe portion sandwiched between the insulating films to form a D mode HEMT.

In the above description, the method of fabricating HEMTs having two different gate threshold voltages has been illustrated. However, if three or more selective growth regions are formed, HEMTs having three or more different gate threshold voltages can be formed on a semiconductor substrate.

In the above description, the fabrication of the semiconductor device including HEMTs. However, the present invention is not limited to this. The present invention is applicable to the fabrication of semiconductor devices including DMTs, MESFETs, and the like. The present invention is also applicable to a method of fabricating a semiconductor device such as an inverter constituted by a plurality of devices, i.e., a plurality of active devices using n-type semiconductor active layers epitaxially grown on a substrate consisting of a semiconductor or the like. Moreover, the present embodiment is applicable to a semiconductor device including a semiconductor integrated circuit of these active devices. The n-type impurity is not limited to Si, but can be replaced with Se, Te, S, or the like.

A method of performing crystal growth of semiconductor layers having different carrier densities and formed on different exposure areas is not limited to the OMVPE method if selective growth is utilized. For example, a CBE method or the like may be used.

A method of the third embodiment according to the present invention will be described below. FIG. 6A to 6F show process steps of the method.

Figure 6A:
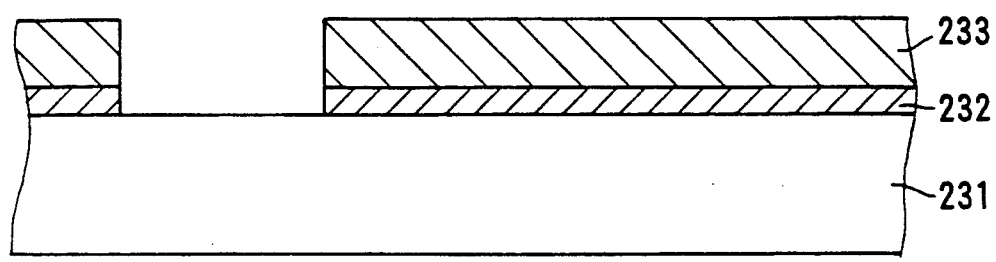
FIGS. 6A to 6F show a method for fabricating a semiconductor device according to the third embodiment of the present invention.

An insulating film 232 (e.g., $SiN_x$ or $SiO_2$) is forming on the entirely exposed surface of a 2° off substrate 231, and a pattern having an opening in a predetermined region is formed by a photoresist 233. The insulating layer 232 is selective etched by RIE. FIG. 6A is a sectional view of the insulating layer 232 left on the 2°-off-substrate upon etching by RIE.

Figure 6B:
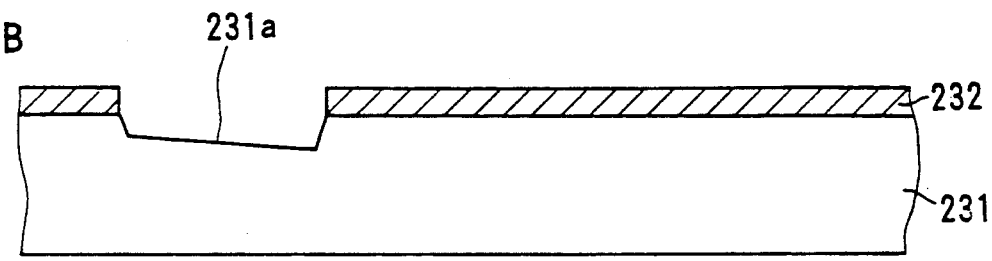

Anisotropic etching of the GaAs substrate 231 is performed using this insulating layer 232 as a mask and an etching solution of sulfuric acid: hydrogen peroxide water = 1:5:1. An exposed surface 231a at the bottom of the resultant recess serves as a just surface (FIG. 6B).

Figure 6C:
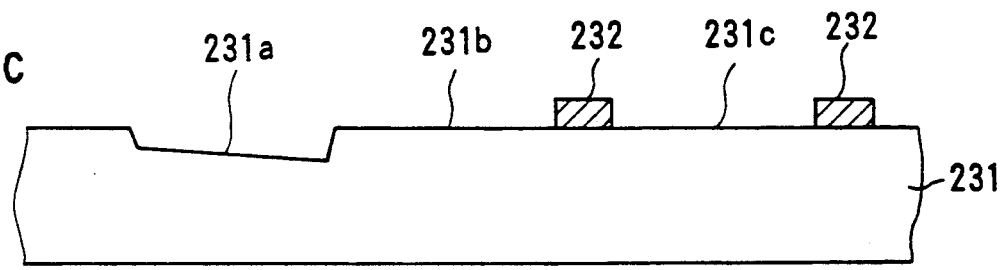
Figure 6D:
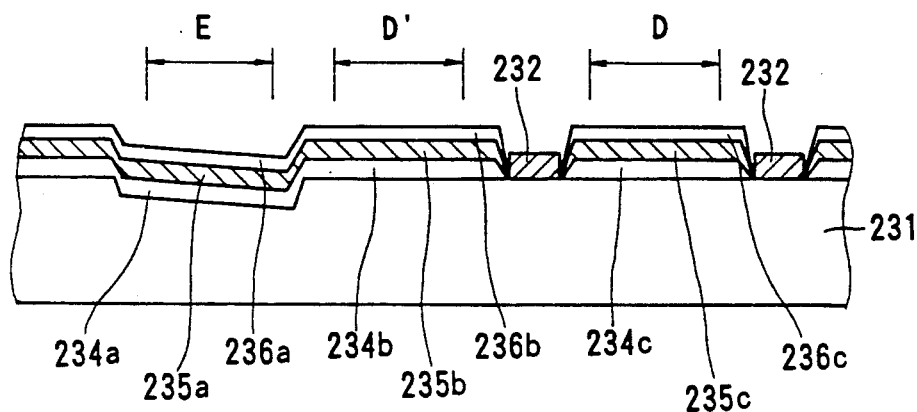
Figure 7:
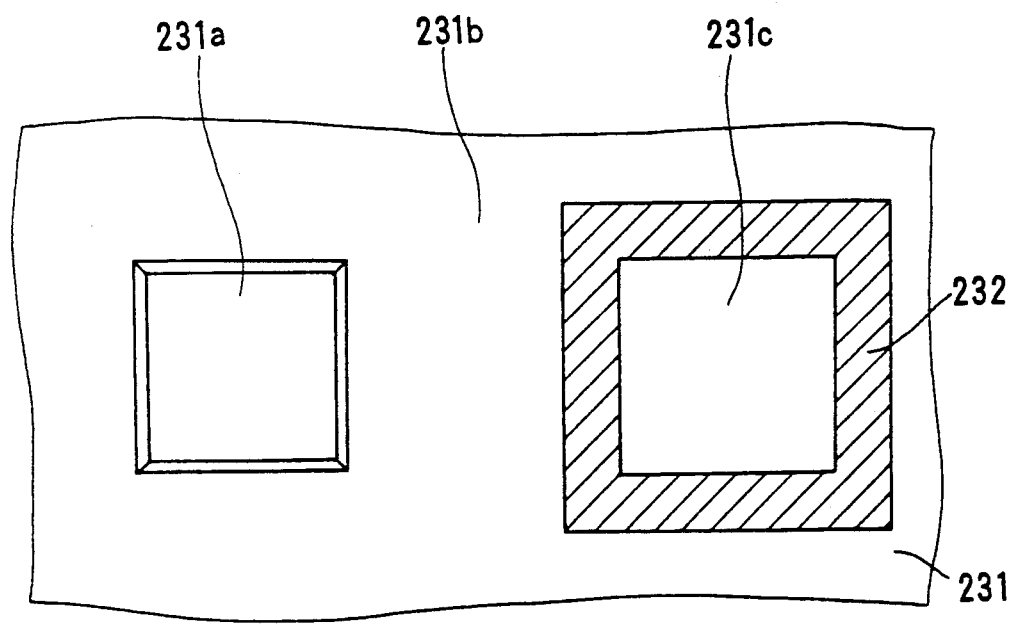
FIG. 7 is a view for explaining a step in the fabricating method of FIG. 6C.

A desired pattern having openings of two or more areas is formed by a photoresist, and the insulating film 232 exposed is selectively etched by RIE, thereby obtaining a mask pattern corresponding to the photoresist pattern (FIG. 6C). The exposed surfaces 231b and 231c surrounded by the openings of the mask pattern remain as the 2°-off-surfaces. FIG. 7 is a plan view of the semiconductor substrate shown in FIG. 6C. An exposes surface 231c in the region surrounded by the insulating film 232 serves as a region in which an active device is formed to have an active region having a higher carrier density than that on the exposed surface 231b in the region not surrounded by the insulating film 232. The exposed surface 213a formed by anisotropic etching is a region in which an active device is formed to have an active region having a lower carrier density than that on the exposed surface 231b kept as the 2°-off-surface.

Figure 1A:
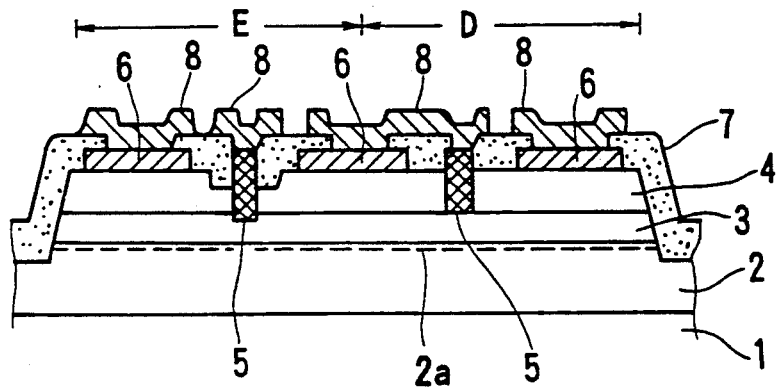
FIGS. 1A and 1B show conventional semiconductor devices manufactured by conventional techniques.
Figure 1B:
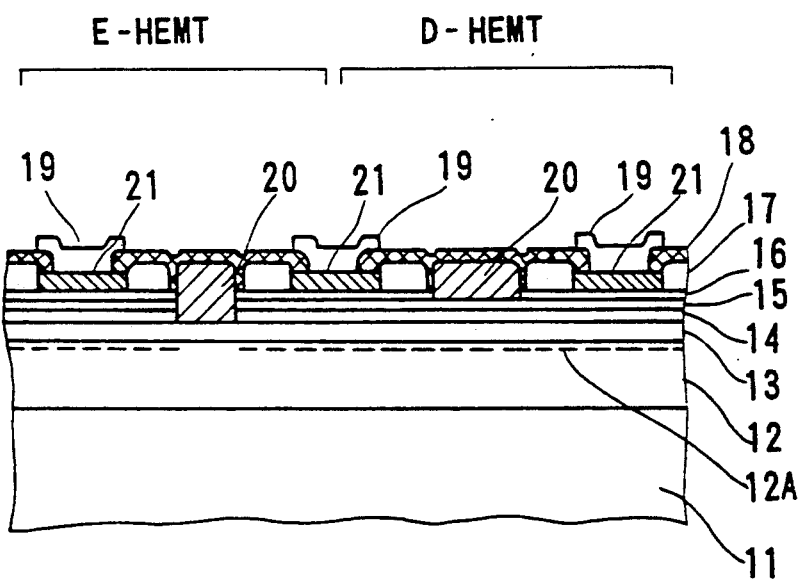

A nondoped GaAs layer 234, an Si-doped AlGaAs layer 235, and an Si-doped GaAs layer 236 are sequentially grown on the semiconductor substrate 231 by the OMVPE method (FIG. 1D). Of these layers, carrier densities of the Si-doped AlGaAs layers 235a, 235b, and 235c will rule gate threshold voltages for an E mode HEMT (region E), an D mode HEMT (region D'), and a D mode HEMT (region D), respectively.

Figure 6E:
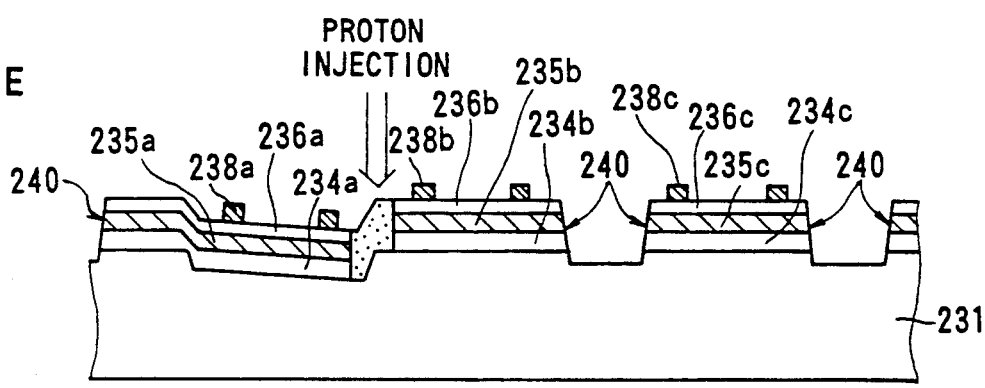

Device isolation is performed by mesa etching or proton injection. (In the illustrated embodiment, a mesa-etched portion 240 is formed between the D mode FETs (regions D and D'), and a proton-injected portion is formed between the D mode HEMT (region D') and the E mode HEMT (region E)). Ohmic electrodes 238a, 238b, and 238c are respectively formed on the Si-doped GaAs layers 236a, 236b, and 236c formed in the previous step (FIG. 6E).

Figure 6F:
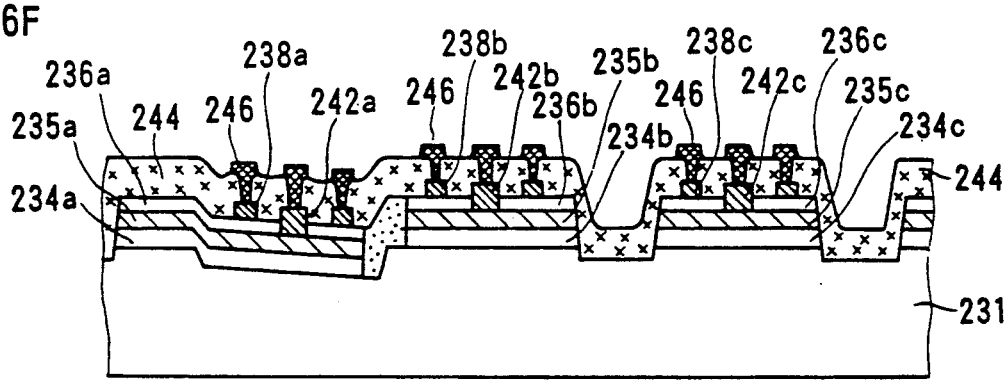

Subsequently, the Si-doped GaAs layers 236a, 236b, and 236c, and the portions of the Si-doped AlGaAs layers 237a, 237b, and 237c are selectively removed from each prospective gate electrode formation region of the E or D mode HEMT in each region E, D', or D. Gate electrodes 242a, 242b, and 242c are formed in the respective prospective gate electrode formation regions. An insulating film (e.g., $SiN_x$ or $SiO_2$) 244 is formed on the entire surface of the resultant structure, a wiring pattern is formed in the insulating film 244, and metal wirings 246 are deposited, thereby completing the process (FIG. 6F).

As has been described above, according to the method of this embodiment, three different semiconductor layers having different carrier densities can be formed by one crystal growth step. When the electrodes for operating active layers consisting of these semiconductor layers is simultaneously formed, FETs having different gate threshold voltages can be easily formed at a high yield. These exposed surfaces on which the active layers are grown may have two or more arbitrary surface orientation or inclination angles if the carrier density differences can be obtained.

Further, there exposed surfaces may have three or more arbitrary regions of selective growth if the carrier density differences can be obtained. Moreover, the areas and surface orientations of the exposed surfaces can be arbitrarily combined. For example, wide and narrow exposed surfaces may be formed in each of the 2°-off-and just surfaces. Therefore, HEMTs having variety of gate threshold voltages can be formed.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A method for fabricating a semiconductor device having a plurality of elemental active devices being operable with different threshold voltages,
   comprising the steps of:
   forming a mask pattern on a semiconductor substrate, the mask pattern partially covering said semiconductor substrate, so that exposed surfaces are formed in a plurality of regions having two or more different areas;
   supplying a material containing an impurity to the exposed surfaces within the regions not covered with said mask pattern, thereby growing a plurality of semiconductor layers having different carrier densities corresponding to the surface areas of said exposed surfaces; and
   fabricating said plurality of elemental active devices on said semiconductor substrate, each elemental active devices being operable with different threshold voltage corresponding the carrier densities of said plurality of semiconductor layers.

2. A method for fabricating a semiconductor device having a plurality of elemental active devices being operable with different threshold voltages,
   comprising the steps of:
   forming an exposed surface having a surface orientation coinciding with a normal to a predetermined crystal plane in a predetermined region on a semiconductor substrate having an exposed surface of a surface orientation slightly inclined from the normal to said predetermined crystal plane by anisotropic etching;
   forming a mask pattern on said semiconductor substrate, the mask pattern partially covering said semiconductor substrate, so that exposed surfaces are formed in a plurality of regions having two or more different areas;
   supplying a material containing an impurity to the exposed surfaces within the regions not covered with said mask pattern, thereby growing a plurality of semiconductor layers having different carrier densities corresponding to the surface orientations and areas of said exposed surfaces; and fabricating said plurality of elemental active devices from said plurality of semiconductor layers, each elemental active devices being operable with different threshold voltages corresponding to the carrier densities of said plurality of semiconductor layers.

3. A method for fabricating a semiconductor device having two elemental active devices being operable with different threshold voltages, comprising the steps of:

forming an exposed surface having a surface orientation coinciding with a normal to a predetermined plane in a predetermined region on a semiconductor substrate having an exposed surface with a surface orientation slightly inclined from the normal to said predetermined plane by anisotropic etching;

supplying a material containing an impurity to the exposed surfaces including portions inside and outside said predetermined region;

growing and laminating a plurality of semiconductor layers on the exposed surfaces including portions inside and outside said predetermined region, respectively fabricating said two elemental active devices from said laminating semiconductor layers on the portions inside and outside said predetermined region; whereby at least one of the laminated semiconductor layers has different carrier densities corresponding to the surface orientations of said exposed surfaces and each elemental active device is operable with different threshold voltages corresponding to the carrier densities of said laminated semiconductor layers.

4. The method according to claim 3, wherein said two elemental active devices are substantially identical, and in said growing and laminating step, said plural semiconductor layers are formed on the exposed surface at the same time.

5. The method according to claim 3, wherein said plural semiconductor layers and said semiconductor substrate are III-V group semiconductor material, and said plural semiconductor layers are grown by the OMVPE method.

6. The method according to claim 3, wherein said device comprises an FET.

7. The method according to claim 3, wherein said device comprises a HEMT.

* * * * *